(12) United States Patent
Liu et al.

(10) Patent No.: US 11,312,623 B2
(45) Date of Patent: Apr. 26, 2022

(54) SEMICONDUCTOR STRUCTURE FOR MEMS DEVICE

(71) Applicant: Taiwan Semiconductor Manufacturing Co., Ltd., Hsin-Chu (TW)

(72) Inventors: Yu-Chia Liu, Kaohsiung (TW); Chia-Hua Chu, Zhubei (TW); Chun-Wen Cheng, Zhubei (TW); Jung-Huei Peng, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/944,399

(22) Filed: Jul. 31, 2020

(65) Prior Publication Data

US 2020/0361767 A1 Nov. 19, 2020

Related U.S. Application Data

(60) Division of application No. 16/211,681, filed on Dec. 6, 2018, now Pat. No. 10,752,497, which is a continuation of application No. 15/193,410, filed on Jun. 27, 2016, now Pat. No. 10,160,639.

(51) Int. Cl.
*H01L 21/00* (2006.01)
*B81C 1/00* (2006.01)

(52) U.S. Cl.
CPC .. *B81C 1/00238* (2013.01); *B81C 2203/0785* (2013.01)

(58) Field of Classification Search
CPC ............... B81C 1/00238; B81C 2203/0785
See application file for complete search history.

(56) References Cited

U.S. PATENT DOCUMENTS

| | | | |
|---|---|---|---|
| 8,987,059 B2 | 3/2015 | Liang et al. |
| 9,040,334 B2 | 5/2015 | Chu et al. |
| 9,065,358 B2 | 6/2015 | Tsai et al. |
| 9,085,455 B2 | 7/2015 | Cheng et al. |
| 9,085,456 B2 | 7/2015 | Tsai et al. |

(Continued)

OTHER PUBLICATIONS

Non Final Office Action dated Apr. 14, 2017 in reference with U.S. Appl. No. 15/182,754.

(Continued)

*Primary Examiner* — Ismail A Muse
(74) *Attorney, Agent, or Firm* — Eschweiler & Potashnik, LLC

(57) ABSTRACT

The present disclosure relates to a method of forming an integrated chip structure. The method includes forming a plurality of interconnect layers within a dielectric structure over a substrate. A dielectric layer arranged along a top of the dielectric structure is patterned to define a via hole exposing an uppermost one of the plurality of interconnect layers. An extension via is formed within the via hole and one or more conductive materials are formed over the dielectric layer and the extension via. The one or more conductive materials are patterned to define a sensing electrode over and electrically coupled to the extension via. A microelectromechanical systems (MEMS) substrate is bonded to the substrate. The MEMs substrate is vertically separated from the sensing electrode.

20 Claims, 7 Drawing Sheets

(56) References Cited

U.S. PATENT DOCUMENTS

| | | |
|---|---|---|
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Chen et al. |
| 9,233,839 B2 | 1/2016 | Liu et al. |
| 9,236,877 B2 | 1/2016 | Peng et al. |
| 9,238,581 B2 | 1/2016 | Wu et al. |
| 9,452,925 B2 | 9/2016 | Zhang |
| 9,567,204 B2 | 2/2017 | Hung et al. |
| 9,884,758 B2 | 2/2018 | Cheng et al. |
| 10,131,541 B2 | 11/2018 | Chu |
| 2004/0077117 A1 | 4/2004 | Ding |
| 2005/0095814 A1 | 5/2005 | Zhu |
| 2007/0132059 A1 | 6/2007 | Tsai et al. |
| 2009/0294879 A1 | 12/2009 | Bhagavat |
| 2010/0025845 A1 | 2/2010 | Merz |
| 2011/0079425 A1 | 4/2011 | Baillin |
| 2011/0108933 A1 | 5/2011 | Nakatani |
| 2011/0121412 A1 | 5/2011 | Quevy |
| 2012/0043627 A1 | 2/2012 | Lin |
| 2012/0142144 A1 | 6/2012 | Taheri |
| 2012/0326248 A1 | 12/2012 | Daneman |
| 2013/0015743 A1 | 1/2013 | Tsai et al. |
| 2013/0168740 A1 | 7/2013 | Chen |
| 2013/0214400 A1 | 8/2013 | Shu et al. |
| 2013/0277777 A1 | 10/2013 | Chang et al. |
| 2013/0334621 A1 | 12/2013 | Classen et al. |
| 2014/0042562 A1 | 2/2014 | Chu |
| 2014/0203421 A1 | 7/2014 | Shu et al. |
| 2014/0225206 A1 | 8/2014 | Lin |
| 2014/0239353 A1 | 8/2014 | Daneman |
| 2014/0264644 A1 | 9/2014 | Wu et al. |
| 2014/0270272 A1 | 9/2014 | Peng |
| 2014/0287548 A1 | 9/2014 | Lin et al. |
| 2015/0008540 A1 | 1/2015 | Chu |
| 2015/0129991 A1 | 5/2015 | Lee |
| 2015/0137303 A1 | 5/2015 | Chou et al. |
| 2015/0158720 A1 | 6/2015 | Lim |
| 2015/0175405 A1 | 6/2015 | Cheng |
| 2015/0175407 A1 | 6/2015 | Cheng et al. |
| 2015/0196912 A1 | 7/2015 | Tsai et al. |
| 2015/0360939 A1 | 12/2015 | Zhang |
| 2016/0060103 A1* | 3/2016 | Hung .................. B81C 1/00238 257/415 |
| 2016/0146705 A1 | 5/2016 | Berkcan |
| 2016/0284656 A1 | 9/2016 | Rinck et al. |
| 2017/0001861 A1 | 1/2017 | Zhang |
| 2017/0005100 A1 | 1/2017 | Cho et al. |
| 2017/0057813 A1 | 3/2017 | Shin et al. |
| 2017/0115322 A1 | 4/2017 | Li et al. |

OTHER PUBLICATIONS

Non-Final Office Action dated Sep. 21, 2017 in connection with U.S. Appl. No. 15/215,753.
Notice of Allowance dated Sep. 28, 2017 in connection with U.S. Appl. No. 15/182,754.
Notice of Allowance dated Jul. 2, 2018 in connection with U.S. Appl. No. 15/215,753.
Non-Final Office Action dated May 25, 2017 for U.S. Appl. No. 15/193,410.
Final Office Action dated Nov. 9, 2017 for U.S. Appl. No. 15/193,410.
Non-Final Office Action dated Mar. 22, 2018 for U.S. Appl. No. 15/193,410.
Notice of Allowance dated Sep. 21 for U.S. Appl. No. 15/193,410.
Non-Final Office Action dated Jul. 23, 2019 for U.S. Appl. No. 16/211,681.
Final Office Action dated Jan. 6, 2020 for U.S. Appl. No. 16/211,681.
Notice of Allowance dated Apr. 22, 2020 for U.S. Appl. No. 16/211,681.

* cited by examiner

SEMICONDUCTOR STRUCTURE FOR MEMS DEVICE

REFERENCE TO RELATED APPLICATIONS

This Application is a Divisional of U.S. application Ser. No. 16/211,681, filed on Dec. 6, 2018, which is a Continuation of U.S. application Ser. No. 15/193,410, filed on Jun. 27, 2016 (now U.S. Pat. No. 10,160,639, issued on Dec. 25, 2018). The contents of the above-referenced Patent Applications are hereby incorporated by reference in their entirety.

BACKGROUND

Microelectromechanical systems, or MEMS, is a technology that integrates miniaturized mechanical and electromechanical elements on an integrated chip. MEMS devices are often made using micro-fabrication techniques. In recent years, MEMS devices have found a wide range of applications. For example, MEMS devices are found in hand held devices (e.g., accelerometers, gyroscopes, digital compasses), pressure sensors (e.g., crash sensors), micro-fluidic elements (e.g., valves, pumps), optical switches (e.g., mirrors), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
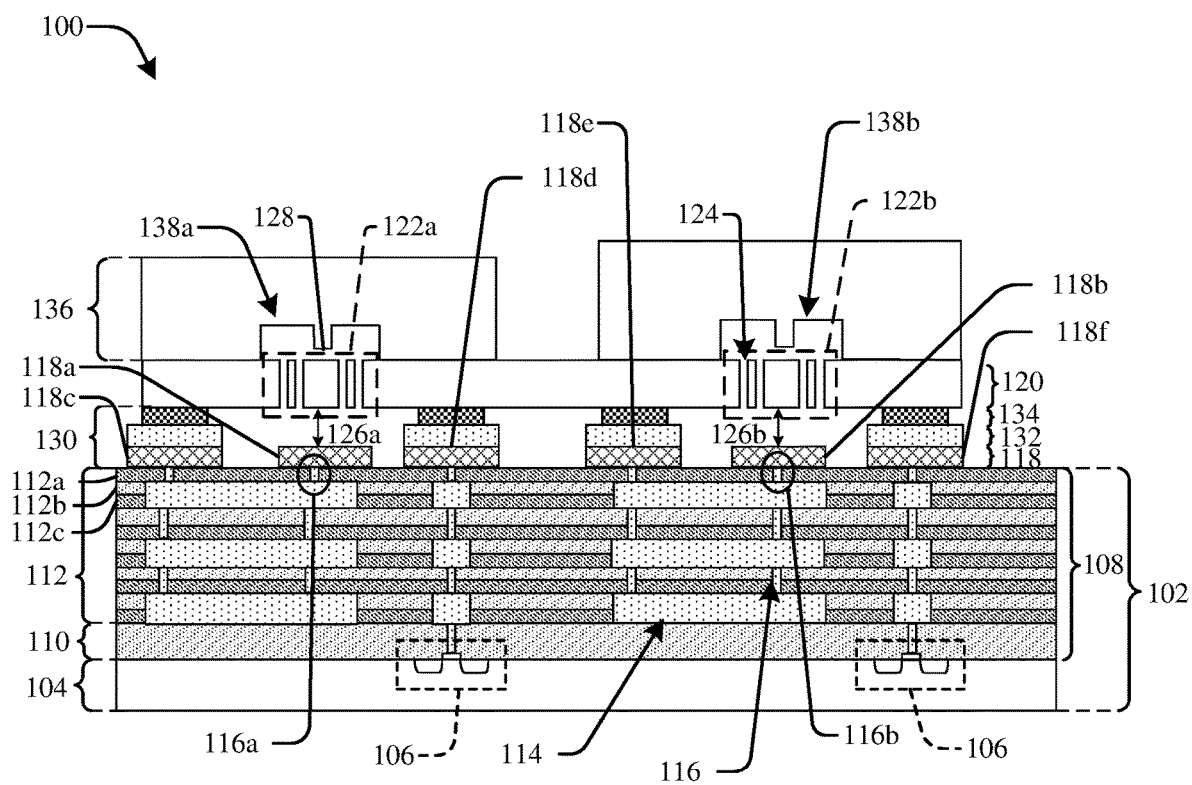
FIG. 1 illustrates a cross-sectional view of an embodiment of a disclosed semiconductor structure for a microelectromechanical system (MEMS) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MEMS (microelectromechanical systems) devices often comprise a moveable, soft mechanical structure. The soft mechanical structure abuts a semiconductor structure having in a cavity that allows the soft mechanical structure to move freely. During operation of the MEMS device, external stimuli (e.g., pressure, acceleration, etc.) may operate upon the soft mechanical structure with a force that causes the soft mechanical structure to move within the cavity. As the soft mechanical structures moves, a capacitance between the soft mechanical structure and a sensing electrode changes. The change in capacitance allows for the external stimuli to be measured by the MEMS device. Because movement of the soft mechanical structure is based upon a pressure within the cavity, the accuracy of a MEMS device is based on the cavity having a predetermined pressure. However, a pressure within the cavity can be affected by out-gassing or by deviations from an expected dimension of the cavity.

Typically, sensing electrodes of a MEMs device are arranged within a BEOL metal stack and are exposed to a cavity by selectively etching the BEOL metal stack. However, it has been appreciated that etching the BEOL metal stack may also expose ILD layers within the BEOL metal stack to the cavity. The ILD layers may comprise materials that can outgas into the cavity, thereby changing a pressure of the cavity acting on the soft mechanical structure of the MEMS device. Furthermore, etching processes used to expose the sensing electrode are difficult to control. This difficulty in etch process control, may reduce an accuracy of the predetermined pressure (since the predetermined pressure is dependent upon a dimension of the cavity) and/or increase a distance between the soft mechanical structure and the sensing electrode.

The present disclosure relates to a method of forming a MEMS device, which forms electrodes over a BEOL stack using a deposition process. Because the electrodes are formed over the BEOL stack using a deposition process, etching of the BEOL stack is avoided, thereby mitigating out-gassing and allowing for improved control of electrode positions. Furthermore, in some embodiments, a passivation layer may be deposited to overly the BEOL stack, which acts to reduce outgassing by blocking outgassing from underlying layers.

FIG. 1 illustrates some embodiments of a cross-sectional view of a disclosed semiconductor structure for a MEMS device. The integrated chip 100 comprises a semiconductor structure 102 having a complementary metal oxide semiconductor (CMOS) substrate 104 with one or more transistor devices 106 disposed therein.

A back-end-of-line (BEOL) stack 108 is disposed over the CMOS substrate 104. The BEOL stack 108 is comprised of an interlayer dielectric (ILD) region 110 underlying an inter-metal dielectric (IMD) region 112. The ILD region 110 may comprise, for example, a low κ dielectric material or an oxide. The IMD region 112 includes a passivation layer 112a overlying a stacked structure having dielectric layers 112b (e.g., silicon dioxide) and etch stop layers 112c (e.g., silicon nitride). In the stacked structure of the IMD region 112, dielectric layers 112b and etch stop layers 112c are stacked in an alternating fashion. In one embodiment, the passivation layer 112a of the IMD region 112 is comprised of a passivation material configured to prevent outgas sing from the IMD region 112. The etch stop layers 112c may also be comprised of the passivation material to prevent outgas sing from adjacent dielectric layers 112b.

A plurality of metal layers, comprising metal wire layers 114 and vias 116, are disposed within the IMD region 112. In various embodiments, the metal wire layers 114 and the vias 116 are comprised of conductive materials, such as aluminum (Al), copper (Cu), tungsten (W), or combinations thereof. In one embodiment, the plurality of metal wire layers 114 increase in size as their distance from the CMOS substrate 104 increases. The metal wire layers 114 may be, for example, copper, aluminum copper, aluminum, tungsten, some other metal, or a combination of the foregoing.

A MEMS substrate 120 is arranged over the semiconductor structure 102. The MEMS substrate 120 comprises one or more MEMS devices (e.g., a pressure sensor, an accelerometer, a gyroscope, etc.) having malleable, soft mechanical structures, 122a and 122b. In some embodiments, the soft mechanical structures, 122a and 122b, comprise one or more openings 124 vertically extending through at least a portion of the MEMS substrate 120. The openings 124 allow for movement of the soft mechanical structures, 122a and 122b (e.g., causing the soft mechanical structures to act as a spring or diaphragm). In some embodiments, the one or more openings 124 are laterally offset from the soft mechanical structures 122a and 122b, to provide electrical isolation within the MEMS substrate 120. In other embodiments, the soft mechanical structures, 122a and 122b, may not have openings.

A carrier substrate 136 is disposed over the MEMS substrate 120. The carrier substrate 136 comprises one or more cavities, 138a and 138b, that are hermetically sealed. The cavities, 138a and 138b, are positioned between the semiconductor structure 102 and the MEMS substrate 120 and are arranged over the soft mechanical structures, 122a and 122b. The one or more cavities, 138a and 138b, allow the soft mechanical structures, 122a and 122b, to move freely within a controlled environment (e.g., pressure) of a respective cavity, 138a or 138b. In some embodiments, an anti-stiction stopper 128 may be disposed onto an exposed surface of the cavities, 138a and/or 138b, to prevent stiction between the soft mechanical structures, 122a and 122b, and the exposed surface of the cavities, 138a and 138b.

An electrode layer 118 is disposed over the passivation layer 112a of the IMD region 112. The electrode layer 118 includes a plurality of electrodes including sensing electrodes, 118a and 118b, and bonding electrodes 118c-118f. The sensing electrodes 118a and 118b are electrically connected to metal wire layers 114 within the IMD region 112 by electrode extension vias 116a and 116b, respectively. The electrode extension vias 116a and 116b are disposed within the passivation layer 112a of the IMD region 112. The passivation layer 112a separates the one or more cavities, 138a and 138b, from the BEOL stack 108, thereby mitigating out-gassing from the ILD region 110 and the dielectric layers 112b into the cavity, 138a or 138b. In some embodiments, the passivation layer 112a and the sensing electrodes 118a and 118b completely cover the BEOL stack 108.

The soft mechanical structures, 122a and 122b, are arranged over the sensing electrodes, 118a and 118b. The vertical distances (i.e., height) between the sensing electrodes, 118a and 118b, and the corresponding soft mechanical structures, 122a and 122b are defined as sensing gaps, 126a and 126b. The smaller the sensing gap the more accurate the MEMS device. The sensing electrodes, 118a and 118b, may be configured to measure a variable capacitance caused by movement of the soft mechanical structures 122a and 122b in the cavities 138a and 138b. For example, the closer the sensing electrode 118a is to the soft mechanical structure 122a, the more sensitive the sensing electrode 118a is to the variable capacitance caused by movement of the soft mechanical structure 122a (i.e., since capacitance is inversely proportional to distance, a smaller distance will result in a measured capacitance changing by a larger amount in response to a stimuli). Because the sensing electrode 118a and 118b are arranged over the passivation layer 112a, the sensing gaps, 126a and 126b, are not formed by etching the IMD region 112. Instead, the sensing gaps 126a and 126b are formed by a deposition process which can be more accurately controlled than an etch process.

A bonding structure 130 is disposed onto a first side of the semiconductor structure 102, facing the MEMS substrate 120. The bonding structure 130 includes the bonding electrodes 118c, 118d, 118e, and 118f of electrode layer 118, an electrically conductive layer 132, and a metalloid layer 134. The bonding electrodes 118c, 118d, 118e, and 118f are laterally offset from the one or more soft mechanical structures, 122a and 122b, and corresponding sensing electrodes 118a and 118b.

The electrically conductive layer 132 provides an electrical connection between the MEMS substrate 120 and the semiconductor structure 102. The electrically conductive layer 132 overlies the electrode layer 118. The metalloid layer 134 overlies the conductive layer 132. Together the electrode layer 118, the electrically conductive layer 132, and the metalloid layer 134 form a bond of the bonding structure 130. The bonding structure 130 is configured to form a hermetic seal that separates the one or more cavities, such as 138a and/or 138b, from an ambient environment. For example, the bonding structure 130 may form the sidewalls of the cavities 138a and 138b. A lower surface of the cavity is comprised of the passivation layer 112a and a sensing electrode 118a and/or 118b. The passivation layer 112a prevents outgassing into the cavities 138a and 138b. Furthermore, as described above, the sensing electrodes 118a and 118b are formed using deposition processes that allows for improved control over the sensing electrode 118a and/or 118b position and dimensions of the cavity 138a and/or 138b, which also affects the predetermined pressure of the cavities 138a and 138b.

Figure 2:
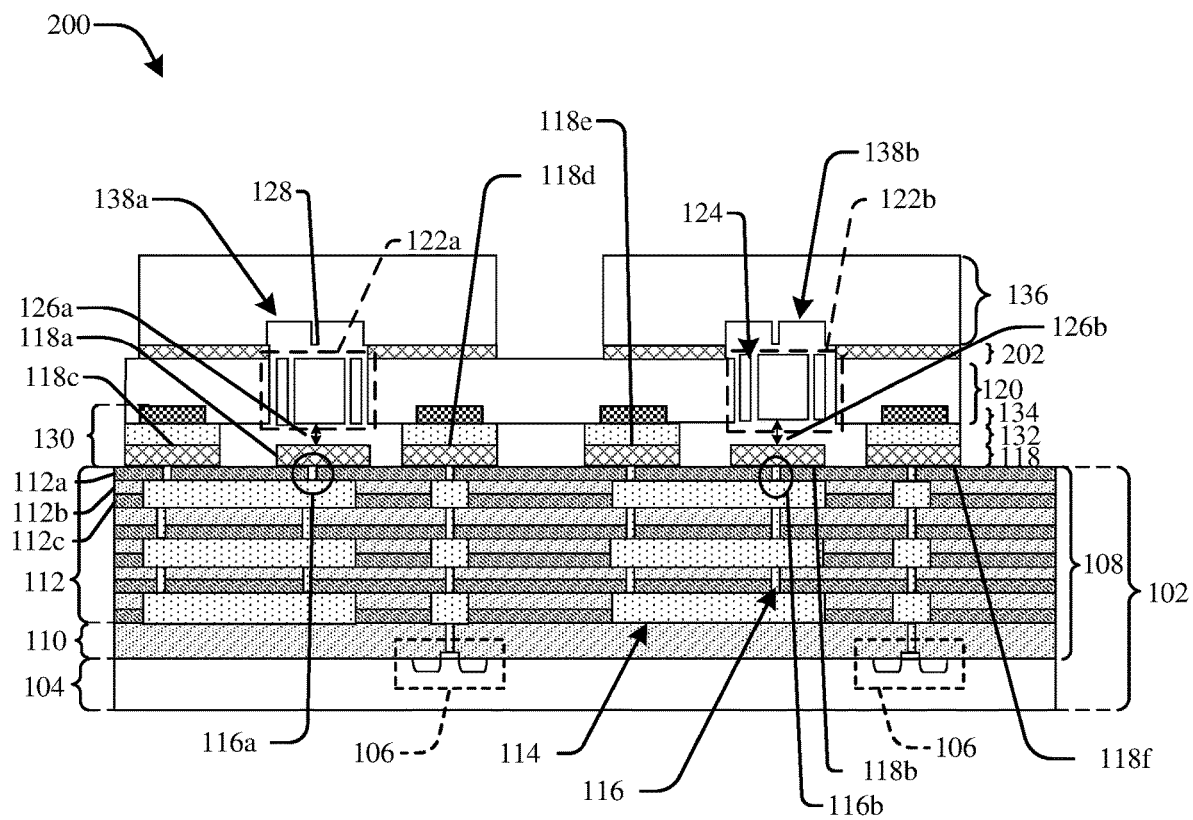
FIG. 2 illustrates a cross-sectional view of an additional embodiment of a disclosed semiconductor structure for a MEMS device.

FIG. 2 illustrates a cross-sectional view 200 of an additional embodiment of a disclosed semiconductor structure for a MEMS device. The semiconductor structure 102 comprises a BEOL stack 108 arranged over a CMOS substrate 104. In some embodiments, the BEOL stack 108 comprises one or more electrode extension vias, 116a and 116b, arranged within a passivation layer 112a disposed over metal wire layers 114 of the BEOL stack 108. The one or more electrode extension vias, 116a and 116b, comprise tungsten. In some embodiments, the metal wire layers 114 may comprise copper or aluminum, so that the tungsten of the one or more electrode extension vias, 116a and 116b, is arranged over the copper or aluminum metal wire layers 114.

An electrode layer 118 is disposed over the passivation layer 112a of the IMD region 112. The electrode layer comprises sensing electrodes 118a-118b arranged over the one or more electrode extension vias, 116a and 116b, and bonding electrodes 118c-118f. In some embodiments, the electrode layer 118 may comprise titanium, titanium nitride, titanium-tungsten, tantalum, and/or tantalum nitride. In other embodiments, the electrode layer 118 may comprise similar conductive materials. In some embodiments, the sensing electrodes 118a-118b may have angled sidewalls that cause a width of the sensing electrodes 118a-118b to decrease as a distance from the semiconductor structure 102 increases.

The semiconductor structure 102 is bonded to a MEMS substrate 120 by a bonding structure 130. The MEMS substrate 120 and the bonding structure 130 operate in a similar manner as described above with respect to FIG. 1. For example, as described above, the semiconductor structure 102 is connected to an overlying MEMS substrate 120 by way of the bonding structure 130. The bonding structure 130 extends from the MEMS substrate 120 to the passivation layer 112a of the IMD region 112.

In some embodiments, the bonding structure 130 has a tapered profile that changes from a first width abutting the MEMS substrate 120 to a second width that is larger in a lower part of the bonding structure 130 adjacent the semiconductor structure 102. For example, the electrically conductive layer 132 is formed to overlie at least one of the bonding electrodes 118c-118f in the electrode layer 118. The electrically conductive layer 132 may be formed as a plurality of sections that have a width equal to or less than the width of the bonding electrodes 118c-118f. Likewise, the metalloid layer 134 may also be formed as a plurality of sections that have a width equal to or less than the width of the plurality of sections of the electrically conductive layer 132. In alternative embodiments, the electrically conductive layer 132 and/or the metalloid layer 134 form layers have widths larger than the width of a bonding electrode 118a and/or 118b.

As discussed above, the smaller the height of the sensing gap, the more sensitive the MEMS device is. The height of the sensing gaps 126a and 126b can be reduced by reducing the height of the bonding structure 130, which reduces the distance between the semiconductor structure 102 and the MEMS substrate 120. In some embodiments, there are openings in the MEMS substrate 120 adapted to recess the plurality of sections of the metalloid layer 134. Accordingly, the metalloid layer 134, and thus a portion of the bonding structure 130, is recessed in the MEMS substrate 120. This reduces the height of bonding structure 130, which consequently reduces the height of the sensing gaps 126a and 126b and allows the sensing electrodes 118a and 118b to be more sensitive to movements of the soft mechanical structures 122a and 122b.

The conductive layer 132 may comprise one or more of copper (Cu), tin (Sn), gold (Au), indium (In), titanium (Ti) or combination thereof. For example, the conductive layer 132 may comprise CuSn, AuSn, or AuIn. The conductive layer 132 may act as an adhesive layer to improve adhesion of the electrode layer 118 and the metalloid layer 134. In such embodiments, the bonding structure 130 may comprise a CuSn—Cu bond, a CuSn—CuSn bond, an AuSn—Au bond, or an AuIn—Au bond. Although the bonding layers shown herein are illustrated as separate bonding layers, the separate bonding layers may comprise atoms from other bonding layers (e.g., adjacent bonding layers), which diffuse during a bonding process. The metalloid layer 134 may be comprised of geranium (Ge).

A carrier layer 202 may be arranged between the MEMS substrate 120 and the carrier substrate 136. The carrier layer 202 includes a plurality of carrier sections. The carrier sections of the carrier layer 202 may be aligned with portions of the carrier substrate 136 offset by the cavities 138a and 138b. The carrier layer 202 may be, for example, a low κ dielectric or silicon dioxide, or a combination of low κ dielectric materials. A low-κ dielectric is a dielectric with a dielectric constant κ less than about 3.9. In an alternative embodiment, the carrier layer 202 is comprised of a passivation material such as silicon nitride.

Figure 3:
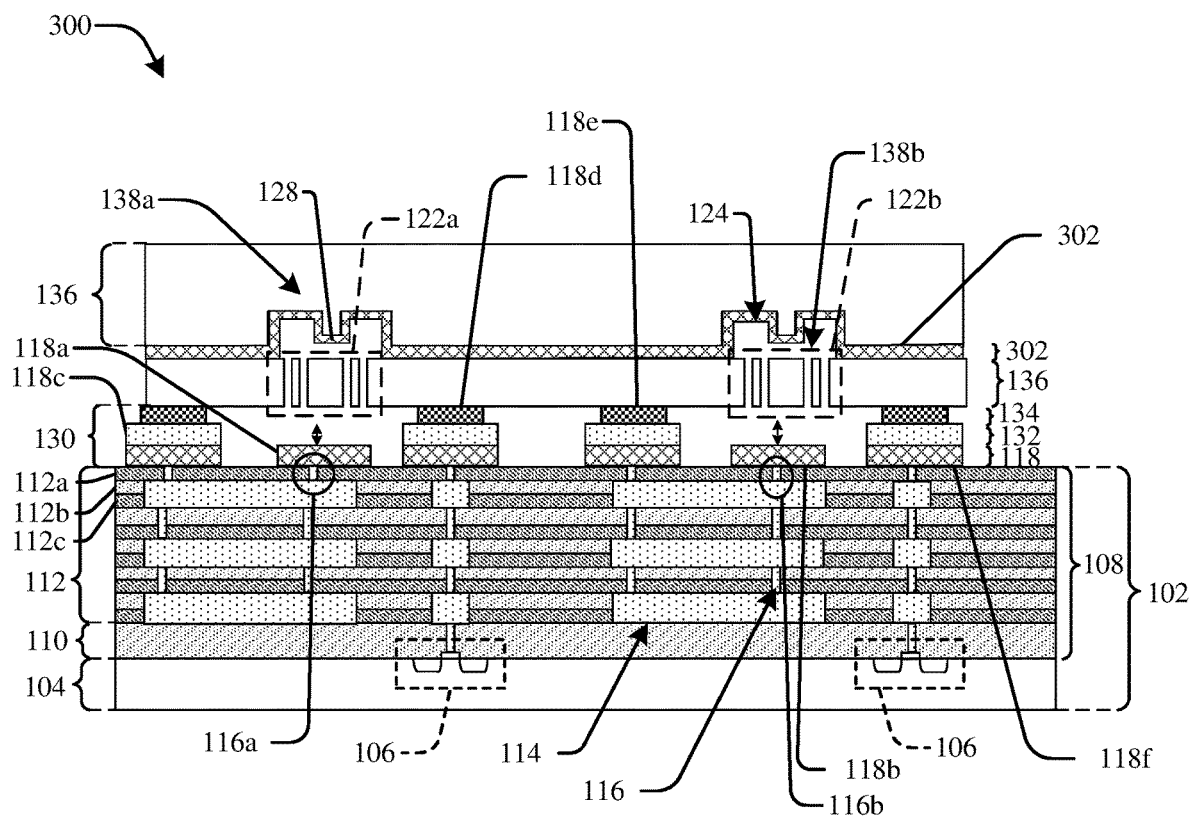
FIG. 3 illustrates a cross-sectional view of an additional embodiment of a disclosed semiconductor structure for a MEMS device.

FIG. 3 illustrates a cross-sectional view of some additional embodiments of a disclosed integrated chip 300 having MEMS devices. A carrier layer 302 is arranged and operates in a similar manner as the carrier layer 202 described above with respect to FIG. 2. A carrier layer 302 is arranged between the MEMS substrate 120 and the carrier substrate 136. However, the carrier layer 302 conforms to carrier substrate 136. For example, the carrier substrate 136 and the carrier layer 302 may together form the one or more cavities 138a and 138b arranged over the soft mechanical structures, 122a and 122b.

FIGS. 4-11 illustrate some embodiments of cross-sectional views showing a method of forming an integrated chip having MEMS devices.

Figure 4:
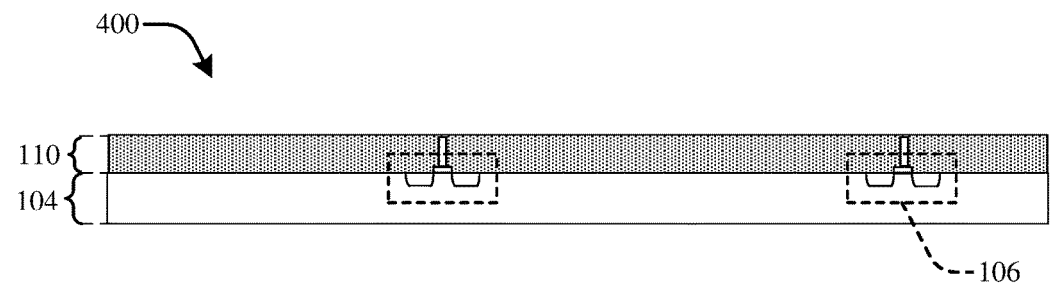
FIGS. 4-11 illustrate cross-sectional views of some embodiments showing a method of forming a semiconductor structure for a MEMS device.

FIG. 4 illustrates some embodiments of a cross-sectional view 400 of forming a semiconductor structure 102 for a MEMS device. In FIG. 4, an interlayer dielectric (ILD) region 110 is formed over a CMOS substrate 104. In one embodiment, the CMOS substrate 104 includes one or more transistor devices 106 disposed therein. The ILD region 110 may comprise, for example, a low κ dielectric or silicon dioxide.

In some embodiments, the CMOS substrate 104 can be a bulk silicon substrate or a semiconductor-on-insulator (SOI) substrate (e.g., silicon on insulator substrate) in the form of a disc-like wafer. The CMOS substrate 104 may also be a binary semiconductor substrate (e.g., GaAs), a tertiary semiconductor substrate (e.g., AlGaAs), a higher order semiconductor substrate, or even a sapphire substrate. The CMOS substrate 104 can include doped regions formed in or on the substrate, epitaxial layers formed in or on the substrate, insulating layers formed in or on the substrate, photoresist layers formed in or on the CMOS substrate 104, and/or conducting layers formed in or on the CMOS substrate 104. In many instances, the CMOS substrate 104, when in the form of a wafer, can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as a "6 inch"); 200 mm (7.9 inch, usually referred to as "8 inch"); 300 mm (11.8 inch, usually referred to as "12 inch"); or 450 mm (17.7 inch, usually referred to as "18 inch"); for example.

Figure 5:
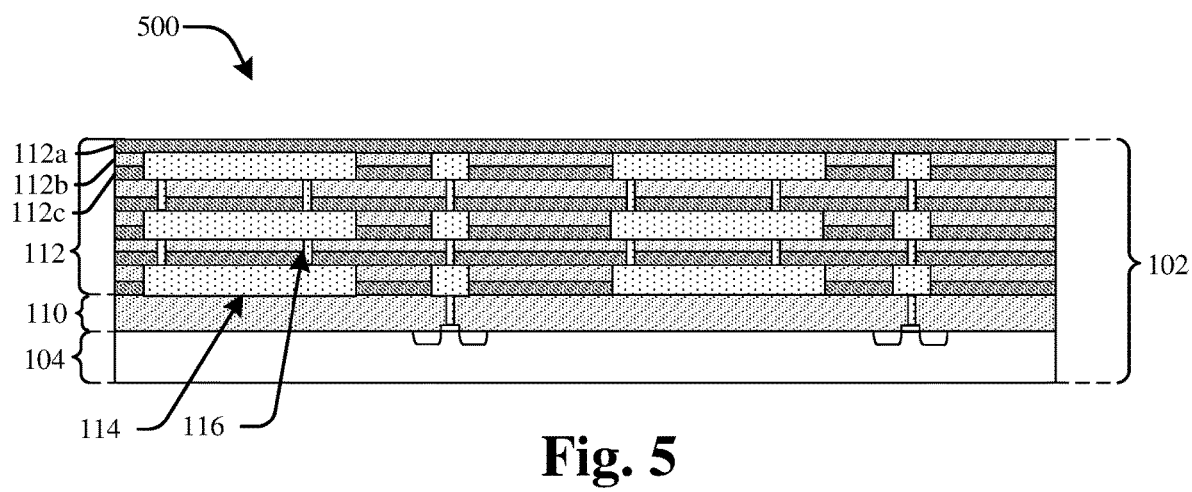

FIG. 5 illustrates some embodiments of a cross-sectional view 500 of forming a semiconductor structure 102 for a MEMS device. An inter-metal dielectric (IMD) region 112 is formed over the ILD region 110. The IMD region 112 includes a passivation layer 112a overlying a stacked structure having dielectric layers 112b (e.g., silicon dioxide) and etch stop layers 112c (e.g., silicon nitride). In the stacked structure of the IMD region 112, dielectric layers 112b and etch stop layers 112c are stacked in an alternating fashion.

Metal layers are disposed within the stacked structure of the IMD region 112. The metal layers may comprise metal wire layers 114 or vias 116. Furthermore, the metal layers may be formed according to a single or dual damascene process. For example, in a dual damascene process, the layers of the IMD region 112 are deposited. Alternatively, the layers of the IMD region 112 may be grown on the CMOS substrate 104 using a thermal oxidation process (e.g., a wet thermal growth process or a dry thermal growth process) or using a deposition process (e.g., PVD, PE-CVD, CVD, etc.).

Figure 6:
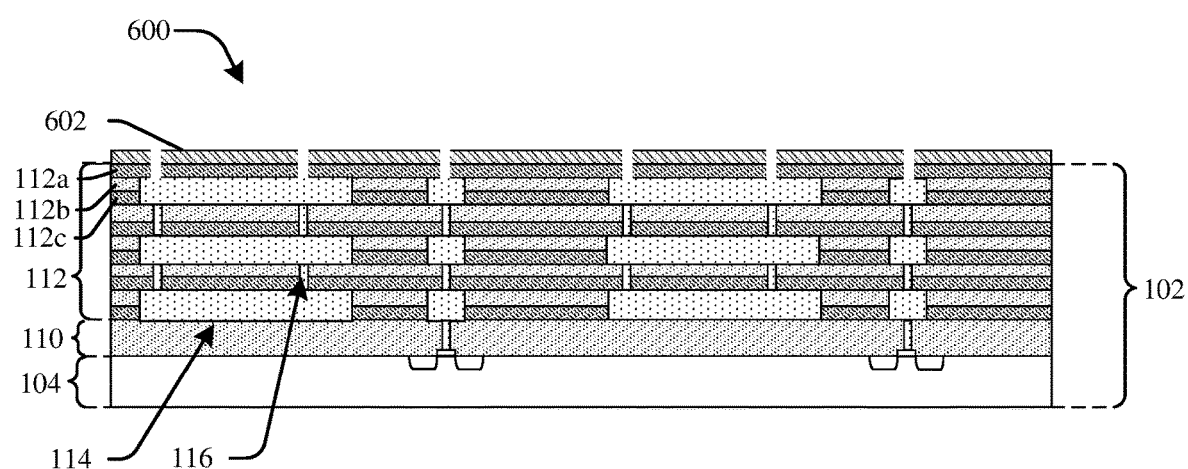

FIG. 6 illustrates some embodiments of a cross-sectional view 600 of forming a semiconductor structure 102 for a MEMS device. In FIG. 6, a mask 602 is formed over the passivation layer 112a. The passivation layer 112a is selectively patterned according to the mask 602 to form openings that expose a metal wire layer 114 of the IMD region 112. In another embodiment, one or more of the dielectric layers 112b or etch stop layer 112c is also patterned to expose a metal wire layer 114 of the IMD region 112. The patterning may include using photomask, hardmask, and/or resists to pattern the one or more layers of the stacked structure.

Figure 7:
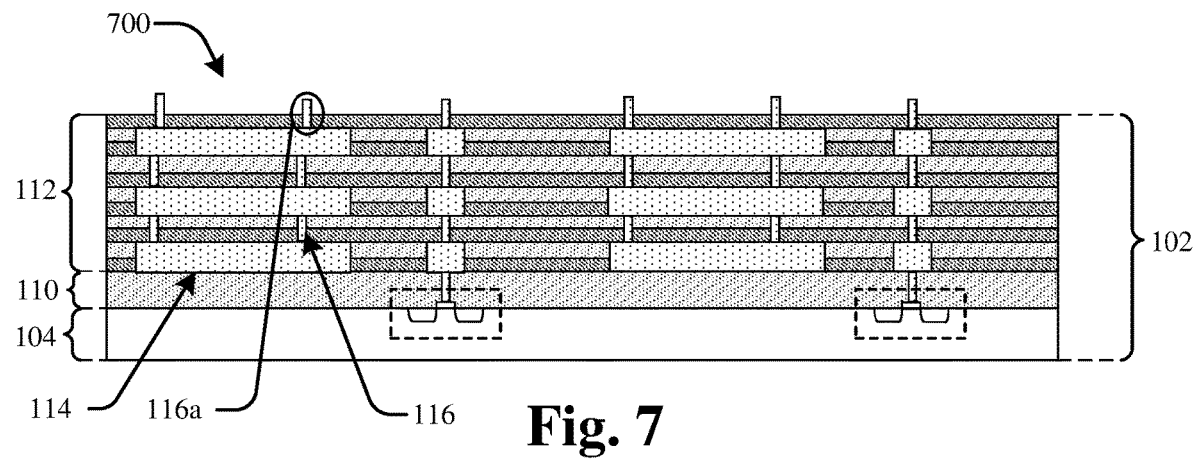

FIG. 7 illustrates some embodiments of a cross-sectional view 700 of forming a semiconductor structure 102 for a MEMS device. In FIG. 7, an electrode extension material is deposited on the etched stacked structure to form one or more electrode extension vias 116a. In particular, the patterned openings are filled with the electrode extension material, which is in direct contact with an exposed metal wire layer 114. The electrode extension material is conductive and may be, for example, a metal, such as aluminum, copper, or tungsten, or a copper aluminum compound.

In one embodiment, the one or more electrode extension vias 116a are formed using a damascene process. For example, the opening is first etched in the passivation layer 112a. After the via hole is formed, a diffusion barrier layer and a seed layer are deposited within the openings. An electro chemical platting process is then used to fill the via with metal (e.g., copper) to form the vias 116.

Figure 8:
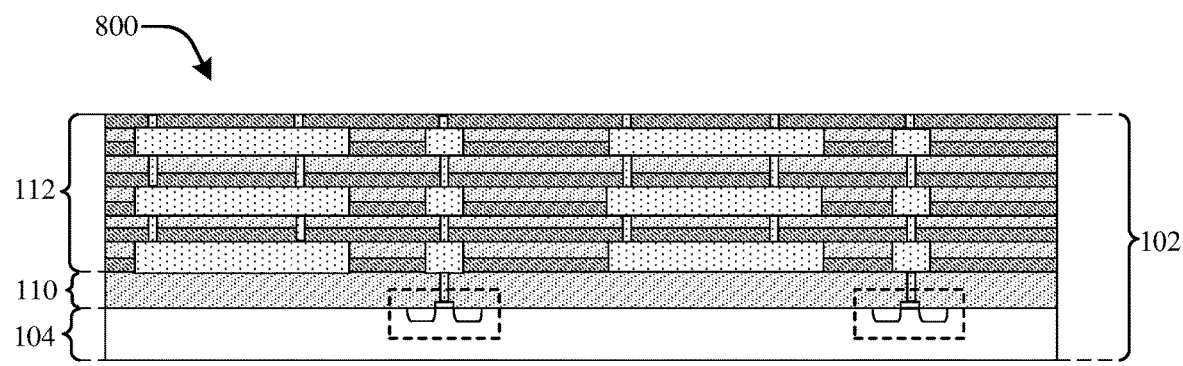

FIG. 8 illustrates some embodiments of a cross-sectional view 800 of forming a semiconductor structure 102 for a MEMS device. In FIG. 8, the electrode extension material is planarized relative to the IMD region 112. In one embodiment, the electrode extension material is planarized using chemical mechanical planarization (CMP).

Figure 9:
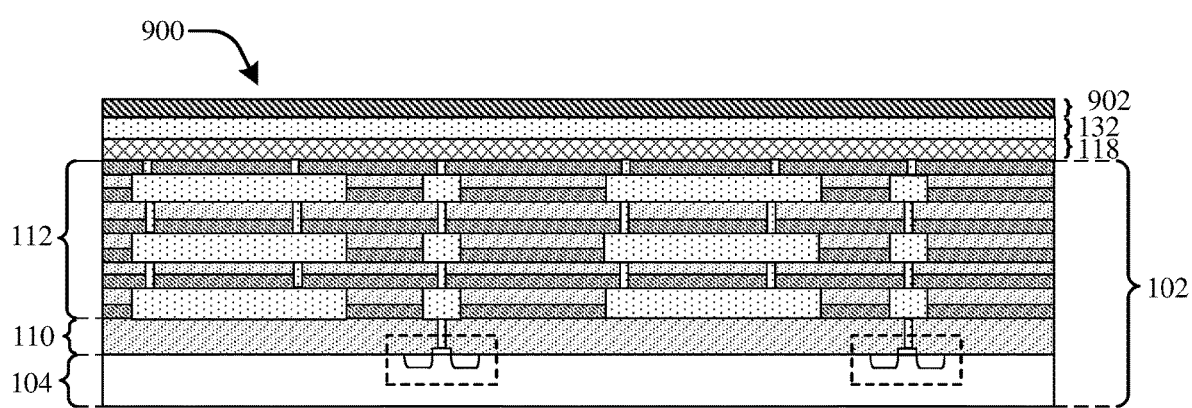

FIG. 9 illustrates some embodiments of a cross-sectional view 900 of forming a semiconductor structure 102 for a MEMS device. In FIG. 9, an electrode layer 118 is selectively deposited over the planarized IMD region 112. Because the electrode layer 118 is formed over the IMD region 112 using a deposition process, etching of the IMD region 112 to form the electrodes is avoided, thereby mitigating out-gassing from ILD layers within the IMD region 112.

Figure 10:
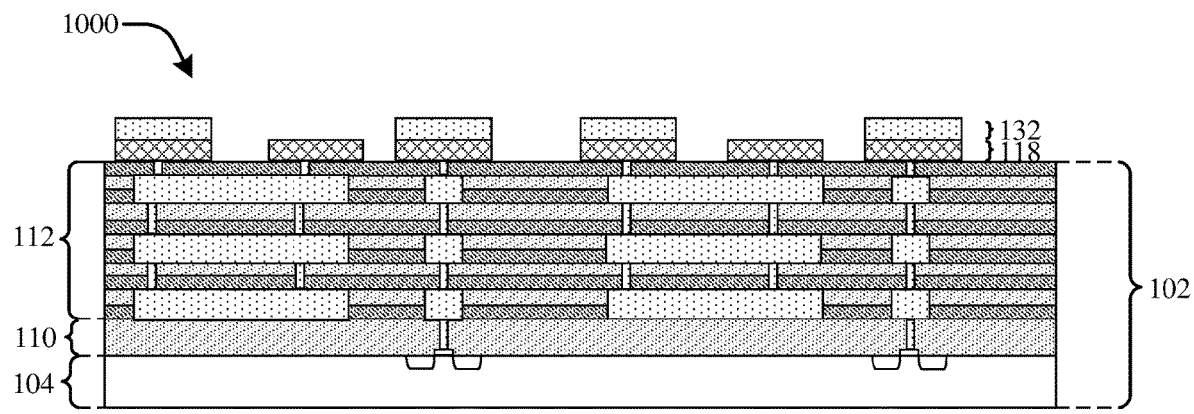

In addition to the electrode layer 118, the electrically conductive layer 132, and a photoresist layer 902 are deposited. In some embodiments, the electrode layer 118 and the electrically conductive layer 132 may be deposited by way of a vapor deposition process (e.g., a CVD process, a PVD process, a PE-CVD process, etc.). Alternatively, the electrode layer 118 and the electrically conductive layer 132 may be formed by a plating process (e.g., an electroplating process, an electro-less plating process, etc.). The electrode layer 118 and the electrically conductive layer 132 may be patterned using photolithography of the photoresist layer 902. In some embodiments, the electrode layer 118 and the electrically conductive layer 132 may comprise one or more of copper (Cu), tin (Sn), gold (Au), indium (In), titanium (Ti), germanium (Ge), silicon (Si), or combinations thereof. In addition to the electrode layer 118, the electrically conductive layer 132, and the photoresist layer 902, the metalloid layer 134 may also be deposited FIG. 10 illustrates some embodiments of a cross-sectional view 1000 of forming a semiconductor structure 102 for a MEMS device. In FIG. 10, the electrode layer 118, a conductive layer 132, and a photoresist layer 902, described above with respect to FIG. 9, are selectively wet etched to form one or more electrodes. Accordingly, as discussed above, the IMD region 112 is not etched to form the electrodes. Instead, the electrode layer 118 is deposited and etched to form the electrodes. As discussed above, plurality of electrodes may include multiple types of electrodes. For example, the plurality of electrodes may include sensing electrodes (e.g., 118a and 118b) and bonding electrodes (e.g., 118c, 118d, 118e, and 118f).

Figure 11:
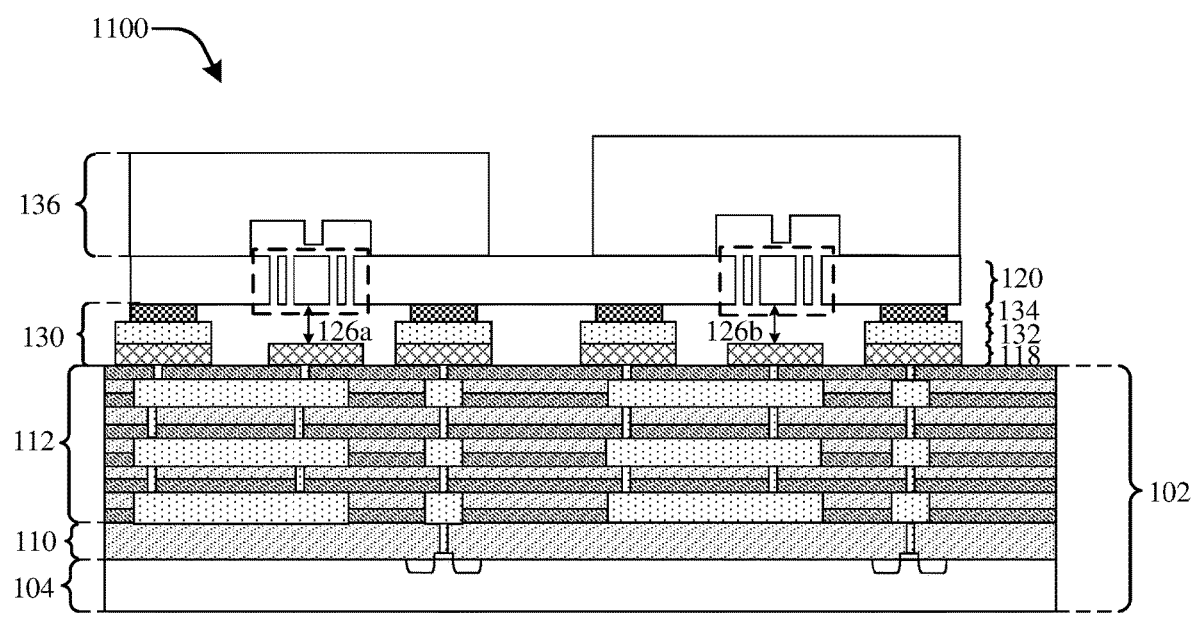

FIG. 11 illustrates some embodiments of a cross-sectional view 1100 of forming a semiconductor structure 102 for a MEMS device. In FIG. 11, the semiconductor structure 102 is bonded to a MEMS substrate 120. The bonding forms one or more cavities overlying the one or more sensing electrodes. Although the one or more bonding layers (e.g., the electrode layer 118, the electrically conductive layer 132, and the metalloid layer 134) are shown as three layers, it will be appreciated that the one or more bonding layers may be a single bonding layer.

In some embodiments, the bonding structure 130 may comprise one or more materials that have a melting temperature of less than 400° C. to enable the low-temperature bonding process. In various embodiments, the low-temperature bond may comprise a eutectic bond or a solid-liquid interdiffusion bond (SLID). In some additional embodiments, the bonding structure 130 may also comprise an alloy have a relatively high melting temperature that enables a back-end-of-the-line packing process to be performed without melting the bonding structure 130. For example, in some embodiments, during bonding the plurality of bonding layers, including the bonding electrodes 118c-118f, the electrically conductive layer 132, and the metalloid layer 134, may form an intermetallic compound having a higher melting temperature than one or more of the plurality of bonding layers (e.g., a melting temperature of greater than or equal to approximately 300° C.).

Figure 12:
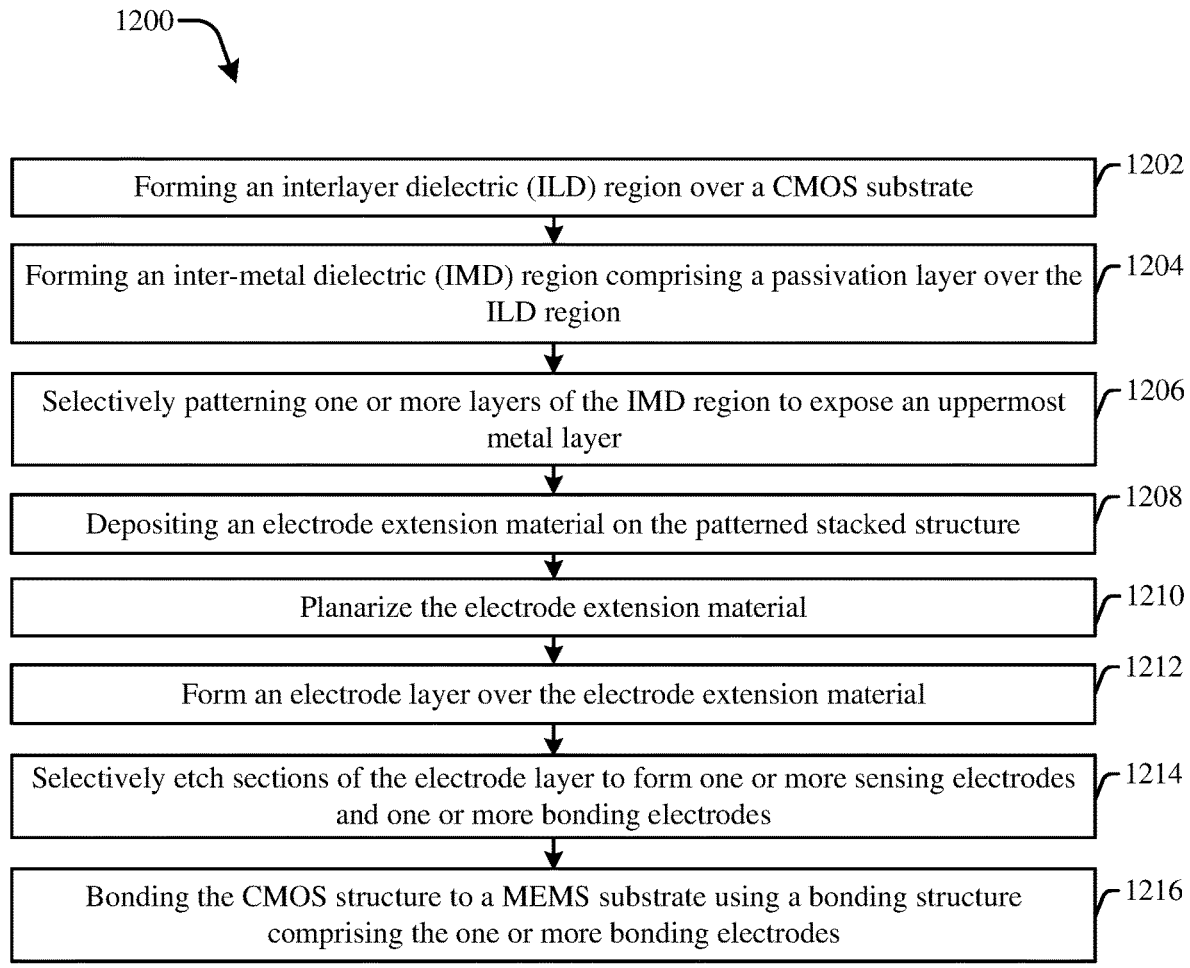
FIG. 12 illustrates an embodiment of a method associated with the disclosed semiconductor structure for a MEMS device.

FIG. 12 illustrates a flow diagram of some embodiments of a method 1200 of forming semiconductor structure for a MEMS device. While disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, an interlayer dielectric (ILD) region is formed over a substrate. In some embodiments, of act 1202 is associated with the cross-sectional view 400 of FIG. 4.

At 1204, an inter-metal dielectric (IMD) region is formed over the ILD region. In some embodiments, of act 1204 is associated with the cross-sectional view 500 of FIG. 5. The IMD region includes a passivation layer 112a overlying a stacked structure having dielectric layers 112b (e.g., silicon dioxide) and etch stop layers 112c (e.g., silicon nitride). In the stacked structure of the IMD region 112, the dielectric layers 112b and the etch stop layers 112c are stacked in an alternating fashion. Metal layers are disposed within the stacked structure of the IMD region 112.

At 1206, one or more layers of the stacked structure are selectively patterned to expose a metal layer of the IMD region. The exposed metal wire layer may be an uppermost metal wire layer of the IMD region 112. In some embodiments, of act 1206 is associated with the cross-sectional view 600 of FIG. 6.

At 1208, an electrode extension material is deposited on the patterned stacked structure to form one or more electrode extension vias. In some embodiments, of act 1208 is associated with the cross-sectional view 700 of FIG. 7.

At 1210, planarization is performed to planarize the electrode extension material. In one embodiment, the planarization is performed using chemical mechanical planarization (CMP) techniques. In some embodiments, of act 1210 is associated with the cross-sectional view 800 of FIG. 8.

At 1212, an electrode layer is formed over the planarized stacked structure. In some embodiments, the electrode layer is formed using a vapor deposition technique, such as chemical vapor or physical vapor deposition, or atomic layer deposition. In some embodiments, of act 1212 is associated with the cross-sectional view 900 of FIG. 9.

At 1214, the electrode layer is selectively etched to form a plurality of electrodes. In some embodiments, of act 1214 is associated with the cross-sectional view 1000 of FIG. 10.

Electrodes of the plurality of electrodes are laterally separated from one another. For example, a first electrode of the plurality of electrodes is separated from a second electrode of the plurality of electrodes without an intervening layer between the electrodes. Furthermore, the plurality of electrodes may include multiple types of electrodes. For example, the plurality of electrodes may include sensing electrodes (e.g., 118a and 118b) and bonding electrodes (e.g., 118c, 118d, 118e, and 188f). The different types of electrodes have different functions. For example, the sensing electrodes provide a sensing function for the MEMS device, and the bonding electrodes for a portion of a bonding structure.

At 1216, the semiconductor structure is bonded to a MEMS substrate. In some embodiments, of act 1216 is associated with the cross-sectional view 1100 of FIG. 11. In one embodiment, the CMOS structure is bonded to a MEMS substrate at one or more of the bonding electrodes to form the bonding structure.

Therefore, the present disclosure relates to a method of forming an integrated chip having one or more MEMS devices, and an associated apparatus. The stacked structure of the IMD region reduces the amount of outgassing that can occur from the semiconductor structure into the cavity. Accordingly, the pressure of the cavity can be more accurately maintained. The pressure in the cavity is also dependent on the dimensions of the cavity. During fabrication, the dimensions of the cavity can be more precisely controlled by depositing and etching the plurality of electrodes rather than etching the plurality of electrodes into the BEOL stack. More precisely controlling the dimensions allows the predetermined pressure in the cavity to be more accurately achieved. Furthermore, the deposition of the layers in the manner described reduces the height of the sensing gap, thereby making the associated MEMS device more sensitive.

In some embodiments, the present disclosure relates to a structure for a microelectromechanical systems (MEMS) device. The structure includes an interlayer dielectric (ILD) region positioned over a substrate. Further the structure includes an inter-metal dielectric region. The IMD region is comprised of a passivation layer overlying a stacked structure. The stacked structure includes dielectric layers and etch stop layers that are stacked in an alternating fashion. Metal wire layers are disposed within the stacked structure of the IMD region. The structure also includes a sensing electrode electrically connected to the IMD region with an electrode extension via. The structure includes a MEMS substrate comprising the MEMS device having a soft mechanical structure positioned adjacent to the sensing electrode.

In other embodiments, the present disclosure relates to a method of forming structure. An interlayer dielectric (ILD) region is formed over a CMOS substrate. An inter-metal dielectric (IMD) region is formed over the ILD region. The IMD region is comprised of a passivation layer overlying a stacked structure. The stacked structure includes dielectric layers and etch stop layers that are stacked in an alternating fashion. Metal wire layers are disposed within the stacked structure of the IMD region. The passivation layer is selectively patterned to expose a metal wire layer of the IMD region. An electrode extension material is deposited on the etched passivation layer to form one or more electrode extension vias. The electrode extension is material is planarized relative to the passivation layer. An electrode layer is selectively deposited on the IMD region and etched to form electrodes. The electrodes include sensing electrodes, positioned over the one or more electrode extension vias, and bonding electrodes. The semiconductor structure is then bonded to the MEMS substrate. The bonding is formed using the bonding electrodes. The bonding forms one or more cavities overlying the sensing electrodes.

In some embodiments, the present disclosure relates to structure for a microelectromechanical systems (MEMS) device. The semiconductor structure includes an interlayer dielectric (ILD) region positioned over a substrate. Further the semiconductor structure includes an inter-metal dielectric region. The IMD region is comprised of a passivation layer overlying a stacked structure. The stacked structure includes dielectric layers and etch stop layers that are stacked in an alternating fashion. Metal wire layers are disposed within the stacked structure of the IMD region. The semiconductor structure also includes a sensing electrode electrically connected to the IMD region with an electrode extension via. The sensing electrode is electrically connected to the IMD region with an electrode extension via. The sensing electrode is positioned adjacent the MEMS device such that a cavity is formed between the sensing electrode and the MEMS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, comprising:
    forming a plurality of interconnect layers within a dielectric structure over a substrate;
    patterning a dielectric layer, which has a bottommost surface arranged along a top of the dielectric structure, to define a via hole exposing an uppermost interconnect of the plurality of interconnect layers;

forming an extension via within the via hole, wherein the extension via is completely confined between a topmost surface and the bottommost surface of the dielectric layer;
forming one or more conductive materials over the dielectric layer and the extension via;
patterning the one or more conductive materials to define a sensing electrode over and electrically coupled to the extension via; and
bonding a microelectromechanical systems (MEMS) substrate to the substrate, wherein the MEMS substrate is vertically separated from the sensing electrode.

2. The method of claim 1, wherein the dielectric layer is formed to contact an upper surface of the uppermost interconnect.

3. The method of claim 1, wherein the extension via comprises a different material than the uppermost interconnect of the plurality of interconnect layers.

4. The method of claim 1, wherein the extension via comprises tungsten and the uppermost interconnect of the plurality of interconnect layers comprises copper.

5. The method of claim 1, wherein the one or more conductive materials comprise a first conductive material and a second conductive material over the first conductive material.

6. The method of claim 5,
wherein the first conductive material comprises titanium or tantalum; and
wherein the second conductive material comprises one or more of aluminum and copper.

7. The method of claim 1, further comprising:
patterning the one or more conductive materials to define a bonding structure laterally separated from the sensing electrode by a non-zero distance.

8. The method of claim 7, wherein a topmost surface of the sensing electrode comprises a different material than a topmost surface of the bonding structure.

9. A method of forming an integrated chip structure, comprising:
forming a plurality of interconnect layers within a dielectric structure over a substrate;
depositing a stack of conductive materials over the dielectric structure, wherein the stack of conductive materials comprises a plurality of different conductive materials;
patterning the stack of conductive materials to define a sensing electrode stack region and a bonding structure laterally spaced apart from one another;
selectively removing a conductive material of the plurality of different conductive materials from the sensing electrode stack region to define a sensing electrode that has a smaller height than the bonding structure; and
bonding a microelectromechanical systems (MEMS) substrate to the bonding structure, wherein the MEMS substrate is vertically separated from the sensing electrode after bonding the MEMS substrate to the bonding structure.

10. The method of claim 9,
wherein prior to patterning the stack of conductive materials, the stack of conductive materials comprises a first conductive material and a second conductive material over the first conductive material, wherein the first conductive material completely separates the second conductive material from the dielectric structure; and
wherein patterning the stack of conductive materials removes the second conductive material to define the sensing electrode without removing the second conductive material to define the bonding structure.

11. The method of claim 9, further comprising:
forming a passivation layer over the dielectric structure; and
forming the stack of conductive materials over the passivation layer.

12. The method of claim 11, wherein the passivation layer comprises silicon nitride.

13. The method of claim 9, wherein the sensing electrode has a smaller height than the stack of conductive materials.

14. The method of claim 9, wherein the sensing electrode has less materials than the stack of conductive materials.

15. The method of claim 9, wherein the stack of conductive materials is formed by way of one or more deposition processes.

16. A method of forming an integrated chip structure, comprising:
forming a plurality of interconnect layers within a dielectric structure over a substrate;
depositing a plurality of conductive materials over the dielectric structure;
performing one or more etching processes after the plurality of conductive materials are deposited, wherein the one or more etching processes selectively remove parts of each of the plurality of conductive materials to define a bonding structure having a first height and a sensing electrode having a second height that is less than the first height; and
bonding a microelectromechanical systems (MEMS) substrate to the bonding structure.

17. The method of claim 16, wherein a topmost surface of the sensing electrode is a different material than a topmost surface of the bonding structure.

18. The method of claim 16, wherein the sensing electrode is electrically coupled to the plurality of interconnect layers.

19. The method of claim 16, wherein the plurality of conductive materials comprise a first conductive material and a second conductive material on an upper surface of the first conductive material, the first conductive material laterally extending between outermost sidewalls of the second conductive material.

20. The method of claim 16, further comprising:
forming a passivation layer over the dielectric structure; and
forming an extension via extending through the passivation layer, wherein the plurality of conductive materials are formed onto the extension via and the passivation layer.

* * * * *